(12) United States Patent
Tamura et al.

(10) Patent No.: US 8,319,253 B2
(45) Date of Patent: Nov. 27, 2012

(54) SEMICONDUCTOR LIGHT-EMITTING DEVICE

(75) Inventors: Wataru Tamura, Tokyo (JP); Chiharu Sasaki, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 142 days.

(21) Appl. No.: 13/009,045

(22) Filed: Jan. 19, 2011

(65) Prior Publication Data

US 2011/0175057 A1  Jul. 21, 2011

(30) Foreign Application Priority Data

Jan. 21, 2010  (JP) .................................. 2010-011030

(51) Int. Cl.
*H01L 33/00* (2010.01)
(52) U.S. Cl. ............ 257/103; 257/86; 257/94; 257/201; 257/E33.002
(58) Field of Classification Search .................... 257/86, 257/94, 103, 201
See application file for complete search history.

(56) References Cited

U.S. PATENT DOCUMENTS

| 5,317,167 | A  | * | 5/1994 | Izumiya et al. ................. 257/13 |
| 2006/0169995 | A1 | * | 8/2006 | Kamakura ...................... 257/94 |
| 2006/0180818 | A1 | * | 8/2006 | Nagai et al. .................... 257/89 |

FOREIGN PATENT DOCUMENTS

| JP | 2002-353502 A | 12/2002 |
| JP | 2004-304090 A | 10/2004 |

* cited by examiner

*Primary Examiner* — Wai Sing Louie
(74) *Attorney, Agent, or Firm* — Holtz, Holtz, Goodman & Chick, PC

(57) ABSTRACT

The device including an active layer composed of AlGaInP, and an n-type clad layer and a p-type clad layer disposed so as to sandwich the active layer, the n-type clad layer and the p-type clad layer each having a bandgap greater than the bandgap of the active layer. The n-type clad layer includes a first n-type clad layer composed of AlGaInP and a second n-type clad layer composed of AlInP; and the second n-type clad layer has a thickness in the range from 40 nm to 200 nm.

7 Claims, 11 Drawing Sheets

US 8,319,253 B2

SEMICONDUCTOR LIGHT-EMITTING DEVICE

BACKGROUND OF THE INVENTION

1. Technical Field

The present invention relates to a semiconductor light-emitting device such as a light-emitting diode (LED), and more particularly to a semiconductor light-emitting device having an AlGaInP-based semiconductor film.

2. Description of the Related Art

Improvements in light-emitting efficiency have expanded the applications for AlGaInP-based LEDs as light sources for display and lighting such as rear combination lamps for automobiles. The structure for an AlGaInP-based LED is summarized below. A GaAs substrate can be used as a growth substrate used for crystal growth of the semiconductor film. A buffer layer, an n-type clad layer, an active layer, a p-type clad layer are laminated or stacked on the GaAs substrate. The active layer has, for example, a quantum well structure composed of AlGaInP and InGaP, for example. The composition of the clad layer is, for example, $(Al_{0.7}Ga_{0.3})_{0.5}In_{0.5}P$. The dopant can be Zn or Mg in the p-type clad layer, and Si, Te or Se in the n-type clad layer. In both cases, the Al composition of the clad layer is set so as to be higher than the active layer.

In a typical AlGaInP-type LED, a sufficient bandgap must be provided between the active layer and the clad layer in order to more effectively provide the carrier confinement effect with the clad layer. In an LED having an emission color from yellow to green, the Al composition of the clad layer has to be especially increased since the bandgap of the active layer is large.

In Japanese Laid-open Patent Publication No. 2002-353502 (referred to as Patent Document 1 hereinafter), the p-type clad layer comprises a first layer composed of $In_{0.49}(Ga_xAl_{1-x})_{0.51}P$ ($0 \leq x \leq 0.15$) and a second layer composed of $In_{0.49}(Ga_yAl_{1-y})_{0.51}P$ ($0.2 \leq y \leq 1$), and the light-emission efficiency can be improved by setting the thickness of the first layer between 0.05 and 0.2 μm. A similar technology is disclosed in Japanese Laid-open Patent Publication No. 2004-304090 (referred to as Patent Document 2 hereinafter).

SUMMARY OF THE INVENTION

Problems with AlGaInP-based LEDs include wide range of variation in the reverse withstand voltage Vr in the wafer surface, and thus a high product deficiency or defect rate, due to the tilt ("off-angle") of the crystal plane relative to the predetermined crystal axis of the growth substrate and due to the semiconductor film growth conditions. The present inventors discovered that the disparities or variations in reverse withstand voltage Vr seen in AlGaInP-based LEDs are caused by the natural superlattice formed in the n-type clad layer. In other words, it was assumed that the ordered arrangement of Al atoms formed in the n-type clad layer exerts an influence on the reverse withstand voltage Vr. The inventors, believing the natural superlattice had to be suppressed in order to suppress the variations in the reverse withstand voltage Vr, and also taking into account light output, studied layered structures for the n-type clad layer.

An object of the present invention is to provide an AlGaInP-based semiconductor light-emitting device able to maintain light output, suppress variations in reverse withstand voltage Vr inside the wafer surface, and ensure high production yields.

The semiconductor light-emitting device of the present invention is a semiconductor light-emitting device having a semiconductor film including an active layer composed of AlGaInP, and an n-type clad layer and a p-type clad layer disposed so as to sandwich the active layer, the n-type clad layer and the p-type clad layer each having a bandgap greater than the bandgap of the active layer, wherein the n-type clad layer includes a first n-type clad layer composed of AlGaInP and a second n-type clad layer composed of AlInP; and the second n-type clad layer has a thickness in the range from 40 nm to 200 nm.

The semiconductor light-emitting device according to the present invention is able to reduce the reverse withstand voltage Vr defect rate caused by the natural superlattice and to ensure a stable, high yield, despite the off-angle of the crystal plane of the growth substrate and the despite the growth conditions in an AlGaInP-based semiconductor light-emitting device and without compromising light output.

DETAILED DESCRIPTION OF THE INVENTION

Figure 1:
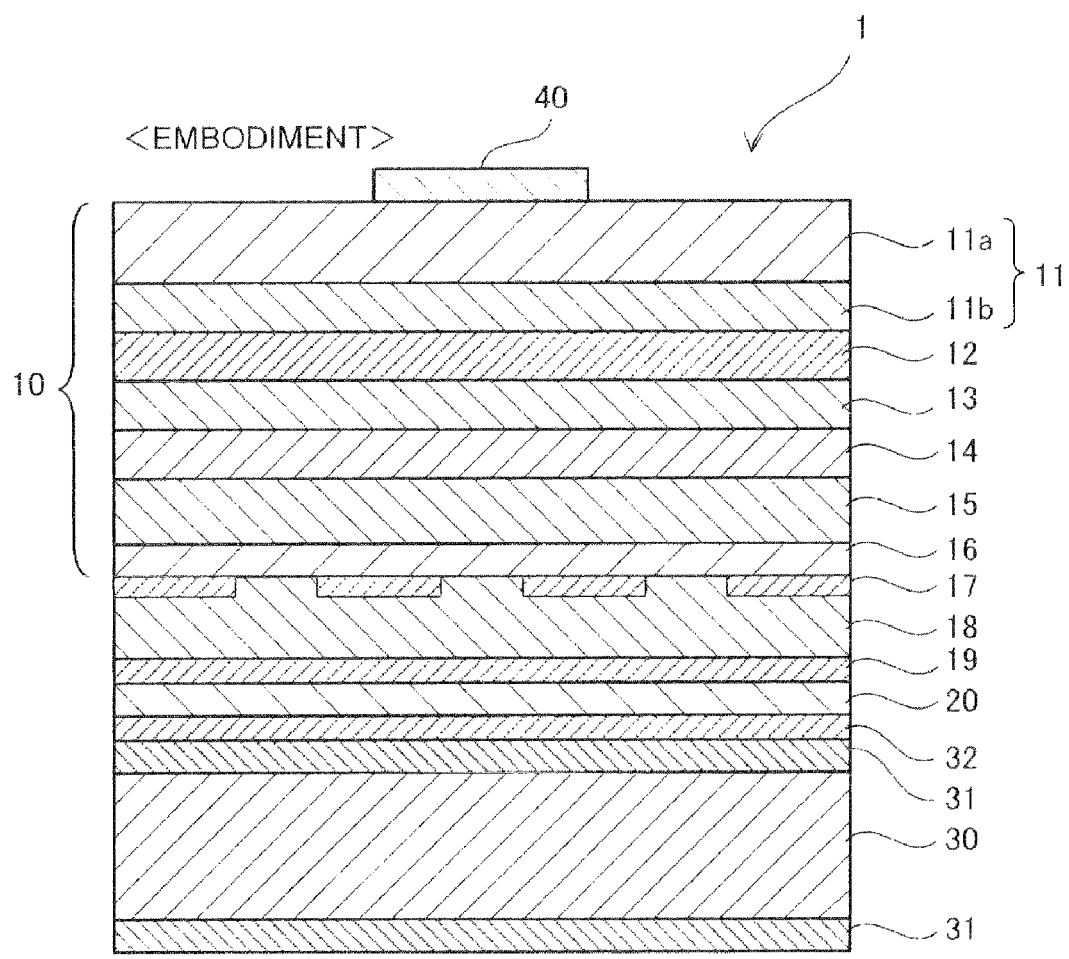
FIG. 1 is a cross-sectional view showing the configuration of the semiconductor light-emitting device according to an embodiment of the present invention.

The inventors obtained knowledge that the cause of reverse withstand voltage Vr defects in AlGaInP-based semiconductor light-emitting devices is the natural superlattice formed in the n-type clad layer. This is described in further detail below. A natural superlattice is a unique phenomenon observed in AlGaInP-based III-V semiconductors, in which an ordered structure of Group III atoms (In, Ga, Al) formed at Group III sublattice points. Among these elements, the ordered arrangement or array of Al atoms is believed to cause the reverse withstand voltage Vr variations in the wafer surface. The degree of order among the atoms depends largely on the growth conditions, such as the growth temperature of the semiconductor film, the V/III ratio and the growth rate, and on the off-angle of the crystal plane of the GaAs substrate used in crystal growth. When an AlGaInP semiconductor film is formed under conditions in which a natural superlattice is readily formed, the arrangement configurations of the regularly arranged Al atoms exist in a random fashion in the wafer surface. When a reverse bias is applied to the semiconductor film in such circumstances, current is believed to flow because of the Al arrangement configuration, and the reverse withstand voltage Vr is decreased. When a probe test is performed on the wafer, these are believed to manifest as reverse withstand voltage defects (or reverse withstand voltage variations). When the n-type clad layer in an AlGaInP-based semiconductor light-emitting device comprises an $Al_{0.5}In_{0.5}P$ single layer, which has a relatively high Al compositional ratio, the reverse withstand voltage Vr defects due to the ordered arrangement of the Al atoms are especially significant. This is clear from the evaluation results for the semiconductor light-emitting device according to Comparative Example-1 described below. When the n-clad layer comprises an $(Al_{0.7}Ga_{0.3})_{0.5}In_{0.5}P$ single layer, which has a relatively low Al compositional ratio, the reverse withstand voltage Vr defects improve significantly, but there is significant hole overflow in the high current region, and the light output is lower than the semiconductor light-emitting device according to Comparative Example-1. This is clear from the evaluation results for the semiconductor light-emitting device according to Comparative Example-2 described below.

The inventors discovered that reverse withstand voltage Vr defects are caused by the natural superlattice (or ordered arrangement of Al atoms) formed in the n-type clad layer, and also discovered a structure in which light output could be maintained while reducing the reverse withstand voltage Vr variations in the wafer surface based on the evaluation results for the semiconductor light-emitting devices according to Comparative Example-1 and Comparative Example-2. More specifically, the n-type clad layer was a two-layer structure comprising a first n-type clad layer of AlGaInP and a second n-type clad layer of AlInP, or a multilayer structure obtained by repeatedly stacking these layers, and the thickness of the second n-type clad layer was optimized.

Embodiments

There follows a description of embodiments of the present invention made with reference to the accompanying drawings. In the drawings indicated below, configurational elements and portions substantially identical or equivalent are denoted by the same reference numerals.

FIG. 1 is a cross-sectional view showing the configuration of a semiconductor light-emitting device 1 according to an embodiment of the invention. The light-emitting device 1 has a "joined" or "bonded" structure in which a semiconductor film 10 composed of an AlGaInP-based material is "joined" or "bonded" via a reflective electrode layer 18 to a conductive support substrate 30 which is prepared separately from a growth substrate used for crystal growth.

The semiconductor film 10 comprises an n-type clad layer 11 composed of a first n-type clad layer 11a and a second n-type clad layer 11b, an active layer 12, and a p-type clad layer 13. The active layer 12 is provided between the second n-type clad layer 11b and the p-type clad layer 13. The active layer 12 has, for example, a quantum well structure in which the composition and thickness of the well layer and the barrier layer are, respectively, $(Al_{0.15}Ga_{0.85})_{0.5}In_{0.5}P$ and 18 nm, and $(Al_{0.5}Ga_{0.5})_{0.5}In_{0.5}P$ and 10 nm. The number of wells is, for example, 30. The composition of the first n-type clad layer 11a is, for example, $(Al_{0.7}Ga_{0.3})_{0.5}In_{0.5}P$, and the composition of the second n-type clad layer 11b is, for example, $Al_{0.5}In_{0.5}P$. The total thickness of the first and second n-type clad layers 11a, 11b is, for example, 3 μm. Among the two, the thickness of the second n-type clad layer 11b is set at 40 to 200 nm. The composition of the p-type clad layer 13 is, for example, $(Al_{0.7}Ga_{0.3})_{0.5}In_{0.5}P$, and the thickness is, for example, 1 μm. The first and second n-type clad layers 11a, 11b, and the p-type clad layer 13 all have a bandgap that is greater than the bandgap of the active layer 12, and function so as to form a potential barrier at the boundary with the active layer 12.

The semiconductor film 10 also includes a p-type intermediate layer 14, a p-type transparent conductive layer 15, and a p-type contact layer 16. The p-type intermediate layer 14 is composed of, for example, $(Al_{0.5}Ga_{0.5})_{0.5}In_{0.5}P$, and the thickness is 20 nm. The p-type transparent conductive layer 15 and the p-type contact layer 16 are composed of, for example, $Ga_{0.95}In_{0.05}P$, and the thickness of each is, respectively, 10 μm and 0.5 μm.

A partially opened insulating layer 17 composed of, for example, $SiO_2$, is formed on a p-type contact layer 16. The insulating layer 17 serves to make the current distribution uniform inside the semiconductor film 10 by regulating the flow of current from the conductive support substrate 30 side. The p-type contact layer 16 is joined to the reflective electrode layer 18 at the opening in the insulating layer 17. The reflective electrode layer 18 can be formed to make ohmic contact with the p-type contact layer 16, and is composed of, for example, a material that reflects light such as AuZn. The reflective electrode layer 18 serves as an electrode and also reflects light radiating from the active layer 12 towards the light extraction surface. A barrier metal layer 19 composed of, for example, TaN/TiW/TaN is provided adjacent to the reflective electrode layer 18, and a joining layer 20 composed of, for example, NiAu is provided adjacent to the barrier metal layer 19. The joining layer 20 is the layer used to bond the semiconductor film 10 and the conductive support substrate 30. The conductive support substrate 30 can be, for example, a silicon substrate. An ohmic metal layer 31 of, for example, Pt is formed on both surfaces, and the substrate is joined to the semiconductor film 10 via an adhesive layer 32 of, for example, AuSn and the joining layer 20.

There follows a description of the method used to manufacture test samples in order to determine the thickness of the second n-type clad layer in the semiconductor light-emitting device according to the embodiment of the present invention described above.

The semiconductor film 10 is formed using metal organic chemical vapor deposition (MOCVD). An n-type GaAs substrate tilted 4° to the [011] direction from the (100) plane (that is, 4° off substrate) is used as the growth substrate used in crystal growth of the semiconductor film 10. The first n-type clad layer 11a and the second n-type clad layer 11b are formed in successive order on the GaAs substrate. The composition of the first n-type clad layer 11a is $(Al_{0.7}Ga_{0.3})_{0.5}In_{0.5}P$, and the composition of the second n-type clad layer 11b is $Al_{0.5}In_{0.5}P$. The total thickness of the first and second n-type clad layers is fixed at 3 μm, and different samples were prepared in which the allotted thickness of the various layers was changed. More specifically, five samples were prepared in which the thickness of the first and second clad layers were 2980 nm/20 nm, 2950 nm/50 nm, 2900 nm/100 nm, 2800 nm/200 nm, and 2500 nm/500 nm.

An active layer 12 with a quantum well structure was formed on the second n-type clad layer 11b. The composition and thickness of the well layer and the barrier layer were $(Al_{0.15}G_{0.85})_{0.5}In_{0.5}P$ and 18 nm, and $(Al_{0.5}Ga_{0.5})_{0.5}In_{0.5}P$ and 10 nm. The number of wells was 30. The p-type clad layer 13 was stacked on the active layer 12. The composition of the p-type clad layer 13 was $(Al_{0.7}Ga_{0.3})_{0.5}In_{0.5}P$, and the thickness was 1 μm. A p-type intermediate layer 14 of $(Al_{0.5}Ga_{0.5})_{0.5}In_{0.5}P$ having a thickness of 20 nm was formed on the p-type clad layer 13. A p-type transparent conductive layer 15 and a p-type contact layer 16 were formed on the p-type intermediate layer 14. The composition of both the p-type transparent conductive layer 15 and the p-type contact layer 16 was $Ga_{0.95}In_{0.05}P$, and the thickness of the layers was 10 μm and 0.5 μm, respectively. The semiconductor film 10 consisted of these layers. The Group V material was phosphine ($PH_3$), and the Group III materials were the organic metals trimethyl gallium (TMGa), trimethyl aluminum (TMAl) and trimethyl indium (TMI). The Si material serving as the n-type impurity was silane ($SiH_4$), and the Zn material serving as the p-type impurity was dimethyl zinc (DMZn). The growth temperature was from 750 to 850° C., hydrogen was used as the carrier gas, and the growth pressure was 10 kPa.

Next, an insulating layer 17 of $SiO_2$ was formed on the p-type contact layer 16 using the CVD method, and the insulating layer 17 was etched and partially removed to partially expose the p-type contact layer 16. Then, a reflective electrode layer 18 of AuZn was formed on the insulating layer 17 by sputtering. The reflective electrode layer 18 was also formed on the p-type contact layer 16 exposed by the opening in the insulating layer 17. A barrier metal layer 19 of TaN/TiW/TaN and a joining layer 20 of NiAu were formed in this order on the reflective electrode layer 18 by sputtering.

Next, the conductive support substrate 30 was prepared. A silicon substrate doped with a p-type impurity to render it conductive was used as the conductive support substrate 30. An ohmic metal layer 31 of Pt was formed on both surfaces of the conductive support substrate 30 by sputtering. The ohmic metal layer 31 formed on one surface of the conductive support substrate 30 serves as the back electrode of the semiconductor light-emitting device 1. An adhesive layer 32 of AuSn and a joining layer 20 of NiAu were formed in successive order on the ohmic metal layer 31 formed on the other surface of the conductive support substrate 20.

Next, the semiconductor film 10 and the conductive support substrate 30 are joined. The joining layer 20 formed on the semiconductor film 10 and the joining layer 20 formed on the conductive support substrate 30 are joined under pressure in a nitrogen atmosphere, and heat fused.

Next, the GaAs substrate (not shown) used for crystal growth of the semiconductor layer 10 was removed with wet etching using a mixture of ammonia water and hydrogen peroxide solution. An ohmic electrode layer 40 composed of AuGeNi/TaN/Ta/Au was formed by sputtering on the first n-type clad layer 11a exposed by the removal of the GaAs substrate, and the ohmic electrode layer 40 was patterned using the lift-off method. Afterwards, heat treatment was performed to form ohmic contact between the semiconductor layer 10 and the ohmic electrode layer 40. A Schottky electrode layer (not shown) composed, for example, of Ta/TiWN/Ta/Au can be provided separately to form Schottky contact with the semiconductor film 10.

After the manufacturing steps described above had been completed, the wafers were diced, and the reverse withstand voltage Vr and the light output of the resulting semiconductor light-emitting devices were evaluated. The results of these evaluations are described below.

Comparative Example-1

Figure 2:
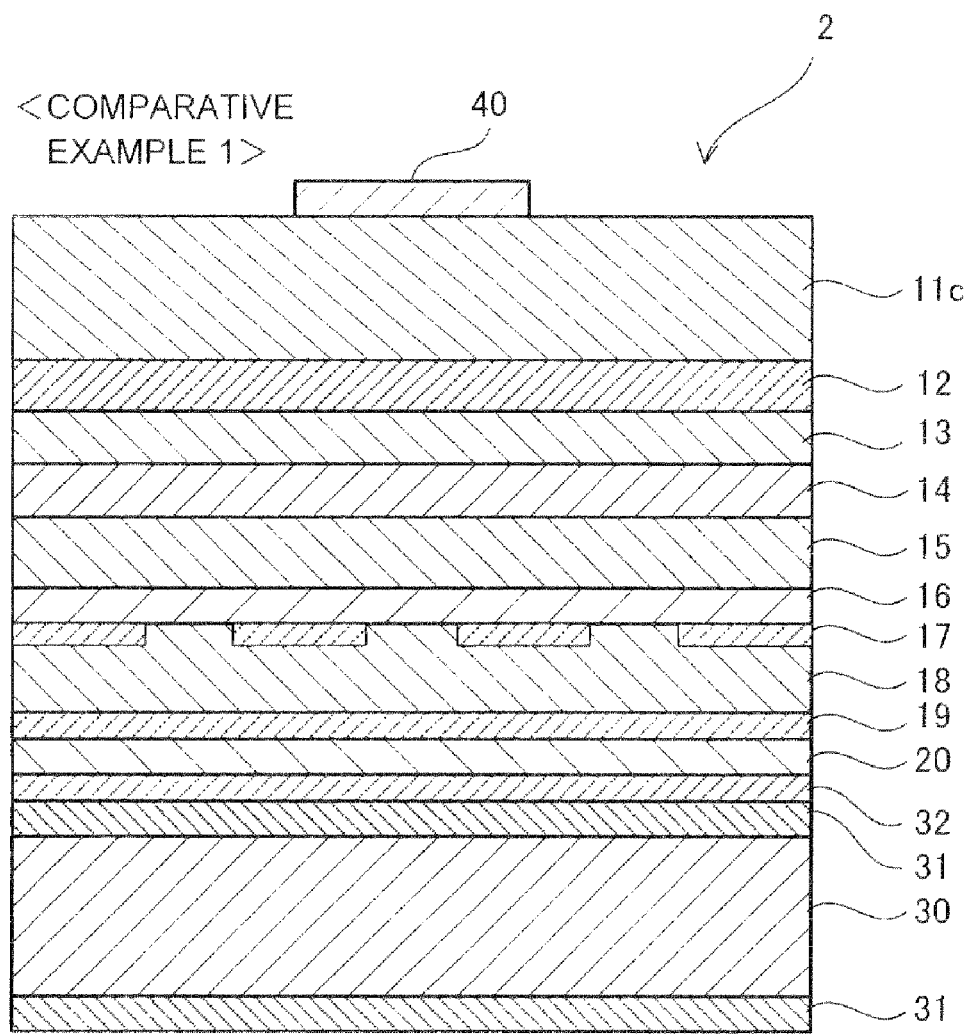
FIG. 2 is a cross-sectional view showing the configuration of the semiconductor light-emitting device according to Comparative Example-1.

A semiconductor light-emitting device 2 having the structure shown in FIG. 2 was prepared as Comparative Example-1 of the semiconductor light-emitting device 1 according to the embodiment of the present invention. The configuration of the n-type clad layer 11c in the semiconductor light-emitting device 2 differed from that of the semiconductor light-emitting device 1 according to the embodiment of the present invention. The n-type clad layer in the semiconductor light-emitting device 2 of Comparative Example-1 was composed of a single layer of $Al_{0.5}In_{0.5}P$, and the thickness of the layer was 3 μm. Because the configuration and the manufacturing method except for the n-type clad layer were the same as those for the semiconductor light-emitting device 1 according to the embodiment of the present invention, further description thereof has been omitted.

Comparative Example-2

Figure 3:
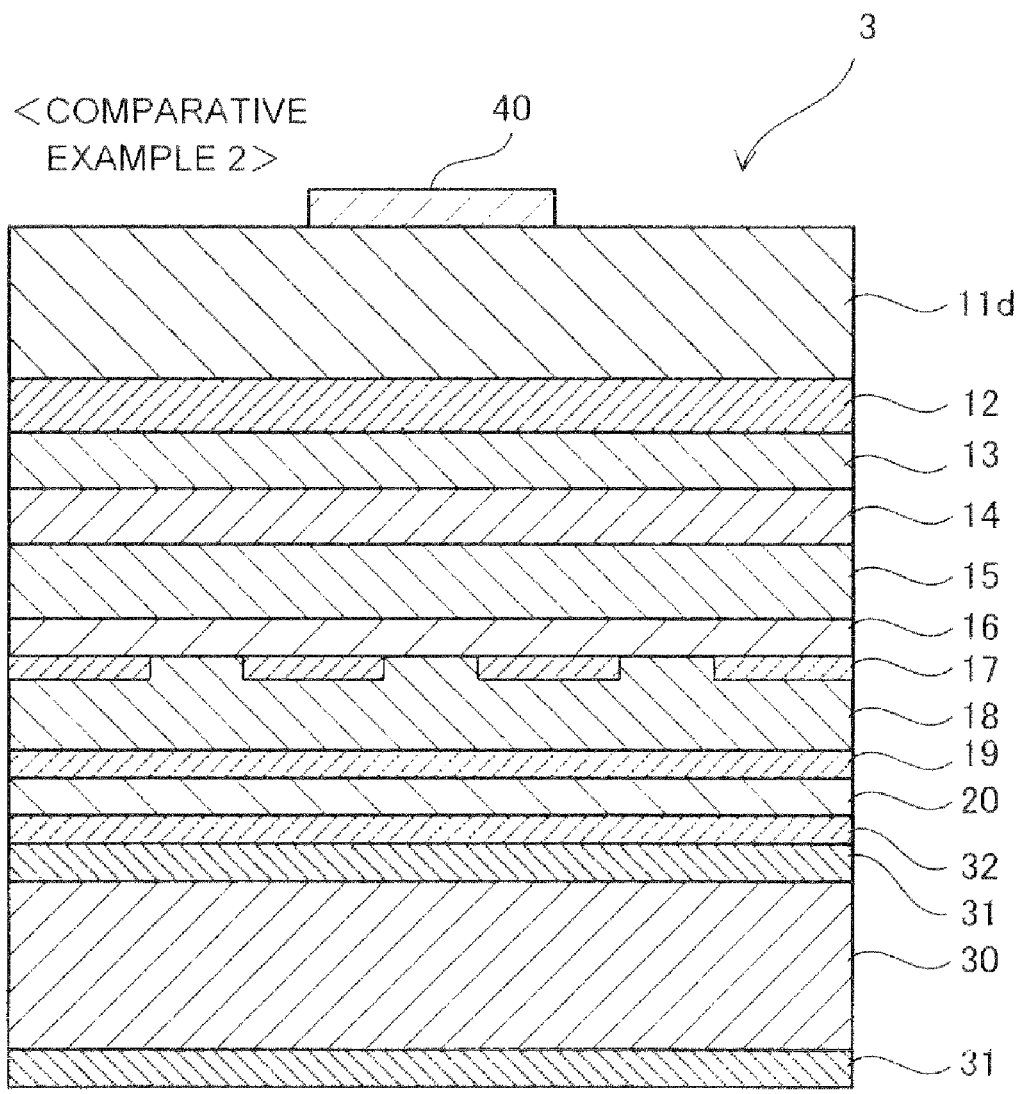
FIG. 3 is a cross-sectional view showing the configuration of the semiconductor light-emitting device according to Comparative Example-2.

A semiconductor light-emitting device 3 having the structure shown in FIG. 3 was prepared as Comparative Example-2 of the semiconductor light-emitting device 1 according to the embodiment of the present invention. The configuration of the n-type clad layer 11e in the semiconductor light-emitting device 3 differed from that of the semiconductor light-emitting device 1 according to the embodiment of the present invention. The n-type clad layer in the semiconductor light-emitting device 3 of Comparative Example-2 was composed of a single layer of $(Al_{0.7}Ga_{0.3})_{0.5}In_{0.5}P$, and the thickness of the layer was 3 μm. Because the configuration and the manufacturing method except for the n-type clad layer were the same as those for the semiconductor light-emitting device 1 according to the embodiment of the present invention, further description thereof has been omitted.

Evaluation Results

Figure 4:
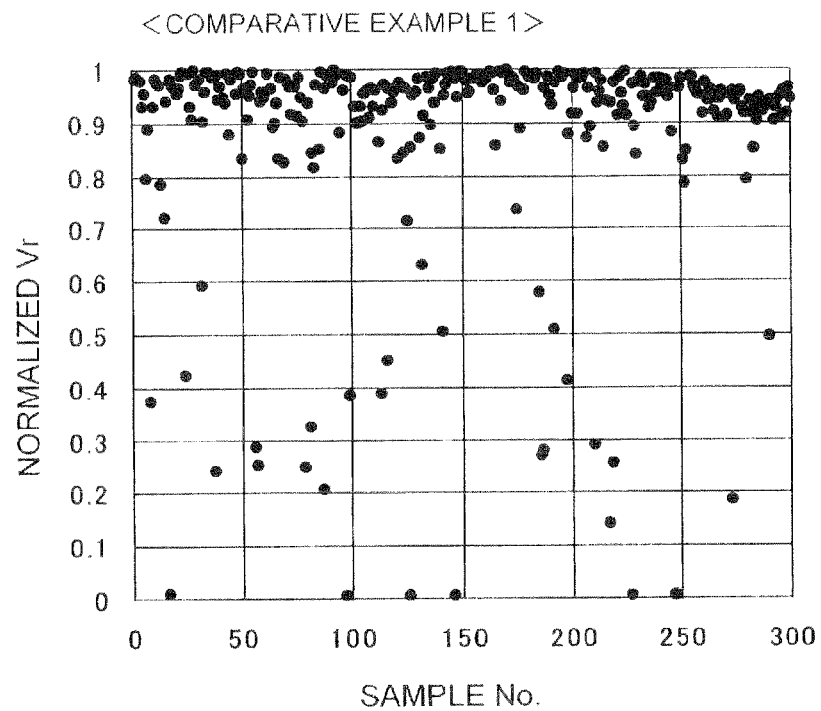
FIG. 4 shows the reverse withstand voltage Vr variations in the wafer surface of the semiconductor light-emitting device according to Comparative Example-1.

FIG. 4 shows the in-plane distribution of the reverse withstand voltage Vr in the wafer surface of the semiconductor light-emitting device 2 of Comparative Example-1. Here, 300 samples were randomly extracted from the wafer, and the reverse withstand voltages Vr of the samples were measured. In FIG. 4, the horizontal axis denotes the sample number, and the vertical axis shows the values normalized using the maximum value for the reverse withstand voltage Vr. The reverse withstand voltage Vr varied randomly in the wafer plane. Also, the reverse withstand voltage Vr values were dispersed more broadly from the maximum value to zero. A histogram of the reverse withstand voltages Vr were created from the measurement result, and a statistical analysis was performed. When a product (i.e., sample) that was within ±10% of the center value of maximum frequency of occurrence was determined to be non-defective and a product that was out of this range was determined to be defective, the defect rate was about 30%. The great variations in the reverse withstand voltage Vr was clearly due to the formation of an ordered arrangement of Al atoms (i.e., natural superlattice) in the n-type clad layer 11c, which exerts an influence on the reverse withstand voltage Vr. Because the composition of the n-type clad layer 11c was $Al_{0.5}In_{0.5}P$ which was a continuous layer having a relatively high Al compositional ratio and the thickness was 3 μm, it is understood that the ordered arrangement of Al atoms was formed randomly in the wafer.

Figure 5:
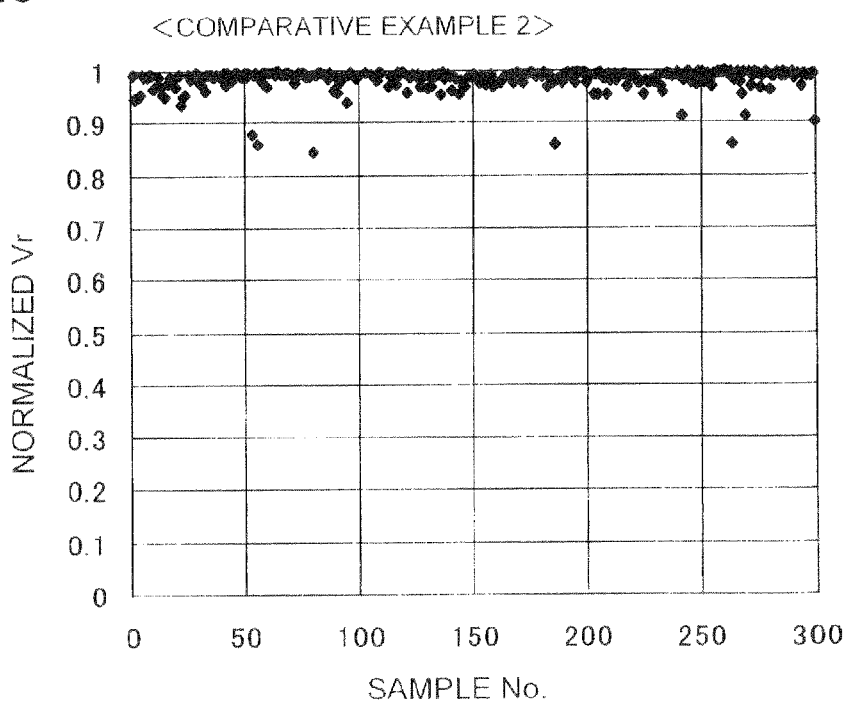
FIG. 5 shows the reverse withstand voltage Vr variations in the wafer surface of the semiconductor light-emitting device according to Comparative Example-2.

FIG. 5 shows the in-plane distribution of the reverse withstand voltage Vr in the wafer of the semiconductor light-emitting device 3 of Comparative Example-2. Here, 300 samples were randomly extracted from the wafer, and the reverse withstand voltages Vr of the samples were measured. In FIG. 4, the horizontal axis denotes the sample number, and the vertical axis shows the values normalized using the maximum value for the reverse withstand voltage Vr. It is clear that the variations in reverse withstand voltage Vr in the wafer plane was significantly lower than Comparative Example-1. When a pass/fail (i.e., non-defective or defective) test was conducted in the same manner as for Comparative Example-1, the defect rate was about 5%. The significant improvement in reverse withstand voltage Vr variations compared to the semiconductor light-emitting device 2 of Comparative Example-1 is believed to be due to the difference in composition for the n-type clad layer. In other words, because the composition of the n-type clad layer 11d of the semiconductor light-emitting device 3 of Comparative Example-2 was $(Al_{0.7}Ga_{0.3})_{0.5}In_{0.5}P$, thus the layer was configured with a relatively low Al compositional ratio compared to the n-type clad layer 11c in Comparative Example-1, it is understood that an ordered arrangement of Al atoms exerting an influence on the reverse withstand voltage Vr is difficult to form.

Next, the light output of the semiconductor light-emitting devices 2, 3 in Comparative Example-1 and Comparative Example-2 were evaluated at 85 A/cm$^2$. When the light output from the semiconductor light-emitting device 2 in Comparative Example-1 was set at 1, the relative light output from the semiconductor light-emitting device 3 in Comparative Example-2 was 0.6 to 0.7. The difference in the Al compositional ratios of the n-type clad layers is appreciated to account for the difference in light output. It is understood that not only the overflow of electrons but also the overflow of holes can not be ignored in the relatively high current region, such as of 85 A/cm$^2$. Because the carrier confinement effect can be more effectively provided by increasing the Al compositional ratio of the n-type clad layer, it is an effective way to include $Al_{0.5}In_{0.5}P$ layer in an n-type clad layer in order to ensure high light output in the high current region. However, an n-type clad layer including $Al_{0.5}In_{0.5}P$ is more susceptible to the formation of an ordered arrangement of Al atoms, which leads to greater variations in reverse withstand voltage Vr.

From the results of the evaluation conducted on the semiconductor light-emitting devices 2, 3 in Comparative Example-1 and Comparative Example-2, the inventors considered that light output could be ensured and the reverse withstand voltage Vr defect rate could be reduced by providing a two-layer n-type clad layer 11 composed of a first n-type clad layer 11a of $(Al_{0.7}Ga_{0.3})_{0.5}In_{0.5}P$ and a second n-type clad layer 11b of $Al_{0.5}In_{0.5}P$ and, based on the fact that reverse withstand Vr defects are due to the natural superlattice formed in the n-type clad layer, by optimizing the thickness of the second n-type clad layer 11b of $Al_{0.5}In_{0.5}P$, which is more likely to form an ordered arrangement of Al atoms. In other words, by limiting the thickness of the second n-type clad layer 11b of $Al_{0.5}In_{0.5}P$, the occurrence of a natural superlattice is considered to be suppressed, and the influence on the reverse withstand voltage Vr can be reduced.

Figure 6:
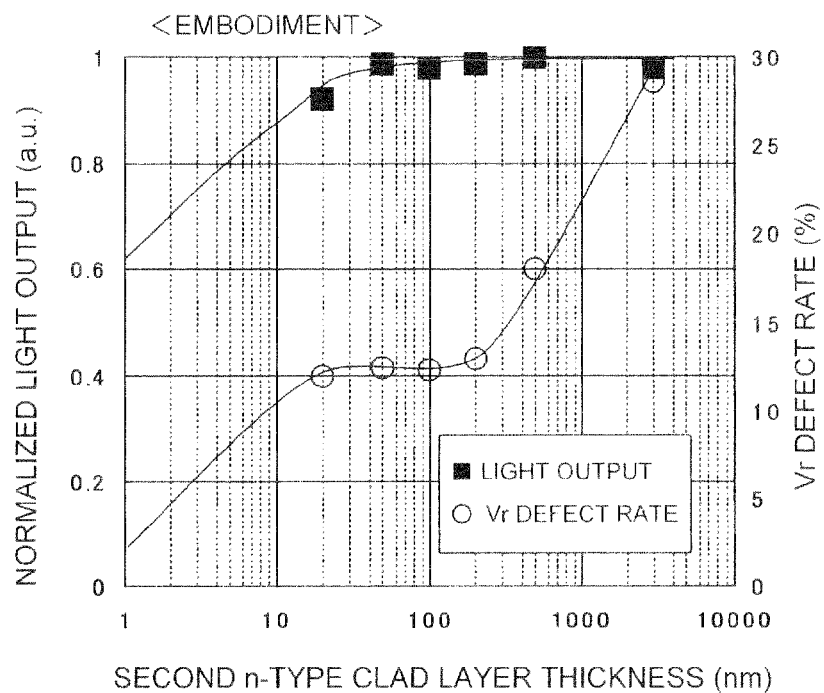
FIG. 6 shows the change in the reverse withstand voltage defect rate and light output when the thickness of the second n-type clad layer is changed in the semiconductor light-emitting device according to an embodiment of the present invention.

FIG. 6 shows the measurement results for the reverse withstand voltage Vr defect rate and light output from the semiconductor light-emitting device 1 according to an embodiment of the present invention. In the graph of FIG. 6, the horizontal axis denotes the thickness of the second n-type clad layer 11b in the n-type clad layers, and the horizontal axis denotes the relative light output and the reverse withstand voltage Vr defect rate where the light output from the semiconductor light-emitting device 2 of Comparative Example-1 is set at 1. The defect rate was calculated based on a pass/fail test similar to the one for Comparative Example-1 described above. The light output improves as the second n-type clad layer ($Al_{0.5}In_{0.5}P$) 11b becomes thicker, and the light output becomes saturated at a thickness above 40 nm. On the other hand, the defect rate increases as the second n-type clad layer 11b becomes thicker. However, the defect rate remains less than about 13% when the thickness of the second n-type clad layer 11b is 200 nm or less.

Figure 7:
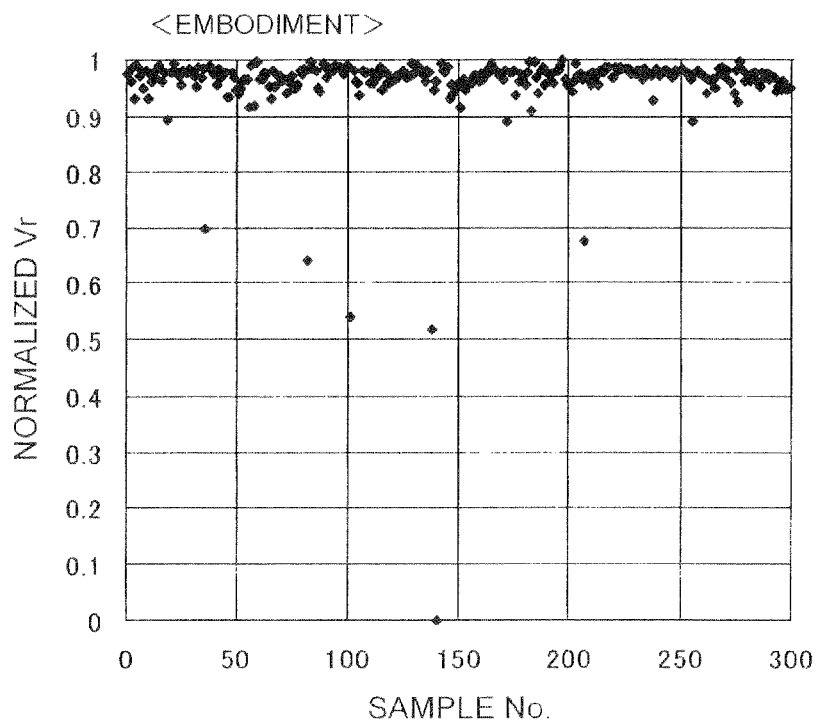
FIG. 7 shows the reverse withstand voltage Vr variations in the wafer surface of the semiconductor light-emitting device according to the embodiment of the invention.

FIG. 7 is a graph showing the in-plane distribution of the reverse withstand voltage Vr in the wafer surface of the semiconductor light-emitting device 1 according to the embodiment of the present invention where the thickness of the second n-type clad layer 11b is 100 nm, and the thickness of the first n-type clad layer 11a is 2900 nm. Here, 300 samples were randomly extracted from the wafer, and the reverse withstand voltages Vr of the samples were measured. In FIG. 7, the horizontal axis denotes the sample number, and the vertical axis shows the values normalized using the maximum value for the reverse withstand voltage Vr. It is clear from FIG. 7 that variations in the reverse withstand voltage Vr of the wafer is significantly lower than that of Comparative Example-1. A histogram of the reverse withstand voltage Vr was created from the measurement result, and a statistical analysis was performed. When a product (or sample) that was within ±10% of the center value of maximum frequency of occurrence was determined to be non-defective and a product that was out of this range was determined to be defective, the defect rate was about 12%. The reverse withstand voltage Vr defect rate is little bit less than that of Comparative Example-2, however, greatly improved compared to that of Comparative Example-1.

As described above, in an AlGaInP-based semiconductor light-emitting device, it has been confirmed that light output can be ensured in the high current range and the reverse withstand voltage Vr defect rate can be reduced by providing an n-type clad layer 11 having a stacked structure composed of a first n-type clad layer 11a of $(Al_{0.7}Ga_{0.3})_{0.5}In_{0.5}P$ and a second n-type clad layer 11b of $Al_{0.5}In_{0.5}P$, and by setting the thickness of the second n-type clad layer 11b from 40 to 200 nm.

In the embodiment, the overall thickness of the n-type clad layer 11 composed of the first and second n-type clad layers was 3 μm, but the same effect can be achieved by setting the thickness of the second n-type clad layer 11b from 40 to 200 nm even when the overall thickness of the n-type clad layer 11 is set to be 1 μm. In other words, a high light output can be ensured and the reverse withstand voltage Vr variations and a defect rate can be reduced by adjusting the thickness of the second n-type clad layer 11b irrespective of the overall thickness of the n-type clad layer 11.

Figure 8:
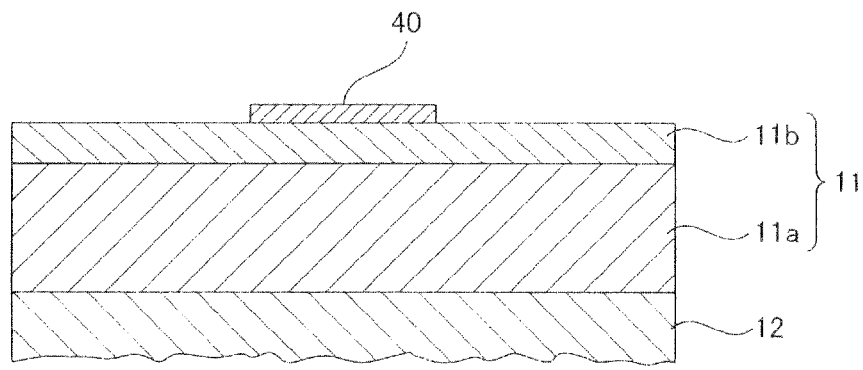
FIG. 8 is a cross-sectional view showing the configuration of the semiconductor light-emitting device according to another embodiment of the invention.

In the embodiment, the layer near the active layer 12 was $Al_{0.5}In_{0.5}P$ and the layer far side was $(Al_{0.7}Ga_{0.3})_{0.5}In_{0.5}P$. However, as shown in FIG. 8, the same effect can be achieved even when the positions of the first n-type clad layer 11a and the second n-type clad layer 11b are exchanged.

Figure 9:
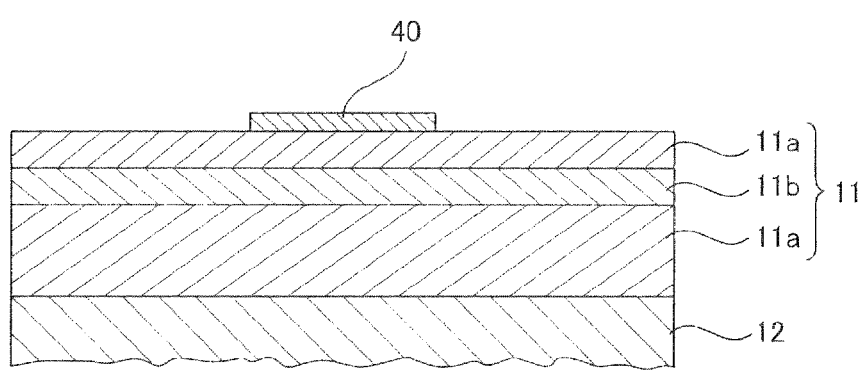
FIG. 9 is a cross-sectional view showing the configuration of the semiconductor light-emitting device according to another embodiment of the invention.
Figure 10:
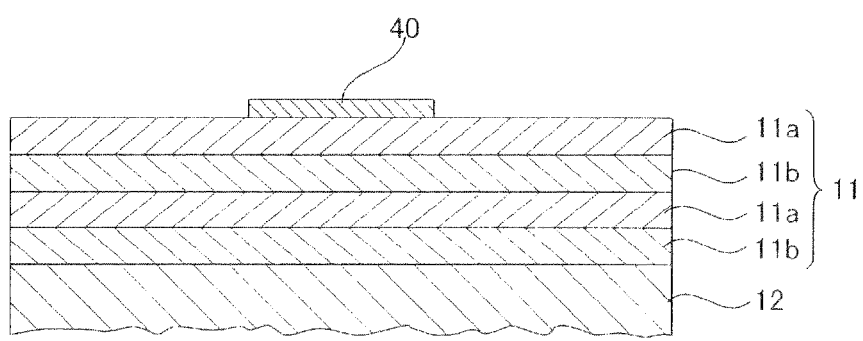
FIG. 10 is a cross-sectional view showing the configuration of the semiconductor light-emitting device according to another embodiment of the invention.

In the embodiment, the first n-type clad layer 11a and the second n-type clad layer 11b are both single layers. However, as shown in FIG. 9, a second n-type clad layer 11b can be disposed or inserted between two first clad layers 11a. For example, the layers can be in successive order from the side near the active layer 12, a first n-type clad layer 11 ($(Al_{0.7}Ga_{0.3})_{0.5}In_{0.5}P$, 2400 nm), a second n-type clad layer 11b ($Al_{0.5}In_{0.5}P$, 100 nm), and a first n-type clad layer 11a ($(Al_{0.7}Ga_{0.3})_{0.5}In_{0.5}P$, 500 nm). As shown in FIG. 10, the configuration can be a laminate composed of several alternating first and second n-type clad layers. In this instance, the thickness of the second n-type clad layers 11b is set in the range of 40 to 200 nm. In short, when the n-type clad layer 11 is configured so that an $Al_{0.5}In_{0.5}P$ layer, which is likely to include an ordered arrangement of Al atoms, does not exceed 200 nm in thickness, the light output can be ensured and reverse withstand voltage Vr defects can be suppressed.

In the embodiment, the composition of the second n-type clad layer 11b is $Al_{0.5}In_{0.5}P$. This is a lattice-matched composition, but the same effect can be obtained even when the ratio between Al and In is changed to have a mismatched composition. In this instance, the compositional ratios of the various elements can be changed within a range that takes into account the relationship between the composition and the critical layer thickness and does not introduce crystal defects (e.g., an In compositional ratio of 0.49 to 0.52). Similarly, in this embodiment, the composition of the first n-type clad 11a is $(Al_{0.7}Ga_{0.3})_{0.5}In_{0.5}P$. However, the same effect can be obtained even when the ratio between Al or Ga and In is changed within a range that does not introduce crystal defects.

In the embodiment, the semiconductor film 10 is supported by a conductive support substrate 30. However, the semiconductor film 10 can also be supported by the GaAs substrate used for crystal growth. In this case, a semiconductor reflective film can be inserted between the GaAs substrate and the semiconductor film. The composition of the active layer 12 is by no means limited to the composition in the embodiment described above, and can be adjusted as necessary to obtain the desired wavelength. The active layer 12 is not limited to a quantum well structure, and can be composed of a single layer. In the embodiment, the p-type transparent electrode layer 15 and the p-type contact layer 16 were composed of $Ga_{0.95}In_{0.05}P$, but GaP and AlGaAs can also be used.

Preliminary Experiment 1

Figure 11:
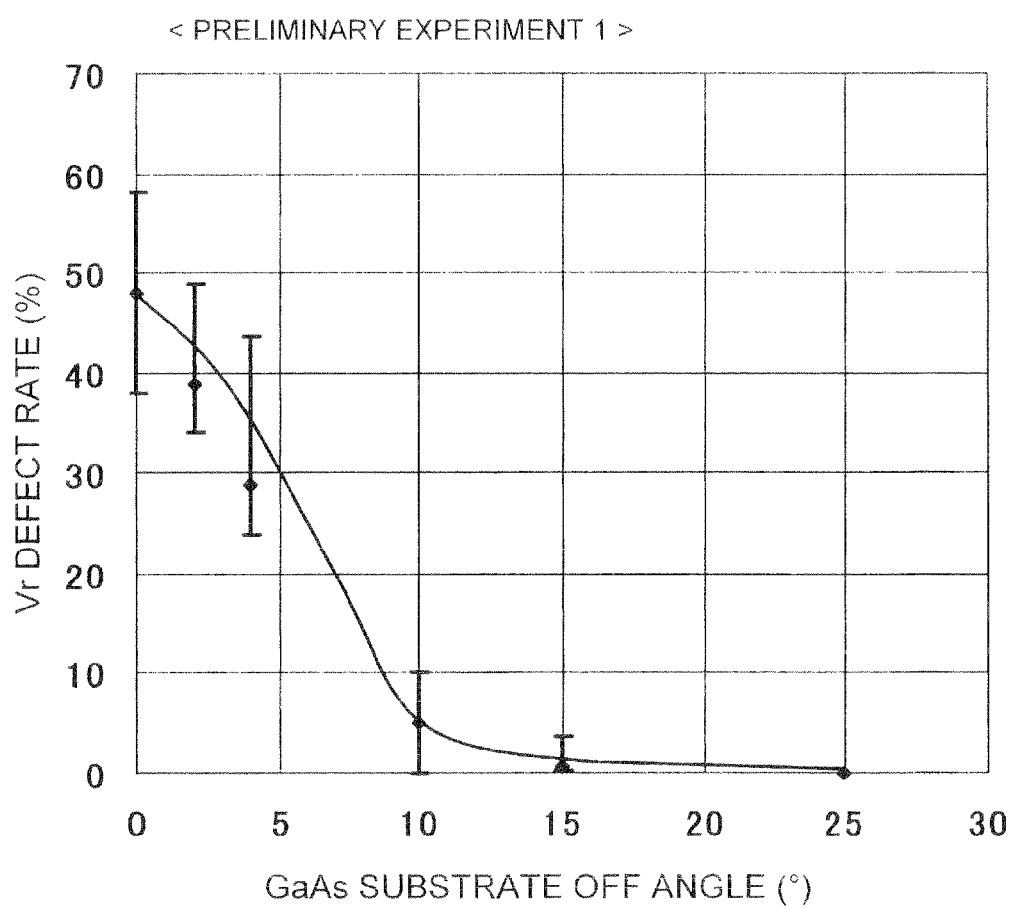
FIG. 11 shows the change in the reverse withstand voltage Vr defect rate when the off-angle of the crystal plane of the growth substrate is changed in an AlGaInP-based semiconductor light-emitting device.

A preliminary experiment was conducted in a manner described below in order to confirm that the cause of in-plane variations of the reverse withstand voltage Vr in the wafer plane of the semiconductor light-emitting device 2 in Comparative Example-1 described above was the formation of a natural superlattice, as shown in FIG. 4. Samples were prepared in which the off-angles for the crystal plane of the GaAs substrate from the (100) plane to the [011] direction were 0°, 2°, 4°, 10°, 15° and 25°, and semiconductor film having the same structure as the semiconductor light-emitting device 2 in Comparative Example-1 was formed on these GaAs substrates. Specifically, a semiconductor film including an n-type clad layer of $Al_{0.5}In_{0.5}P$ and having a thickness of 3 μm was formed on the GaAs substrates having different off-angles. The growth conditions for all samples were the same. Electrodes were attached to the semiconductor film, the reverse withstand voltage Vr was measured, and the defect rate was calculated. FIG. 11 is a graph showing the relationship between the off-angle of the crystal plane of the GaAs substrate and the reverse withstand voltage Vr defect rate. It was confirmed that a smaller off-angle for the crystal plane of the GaAs substrate increases the reverse withstand voltage Vr defect rate.

Figure 12:
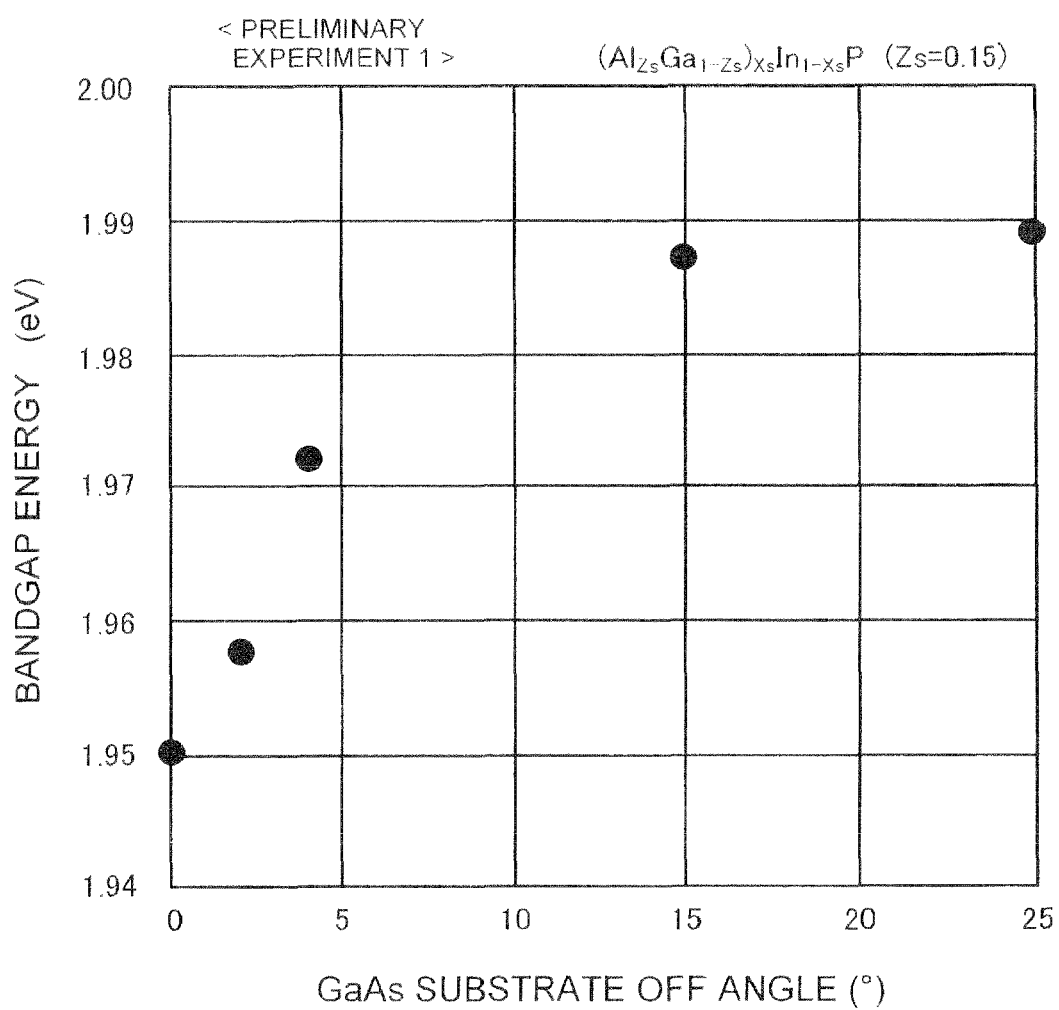
FIG. 12 shows the change in the bandgap when the off-angle of the crystal plane of the growth substrate is changed in an AlGaInP-based semiconductor light-emitting device.

It is clear from the following data that a natural superlattice is more likely to occur when the off-angle for the crystal plane of the GaAs substrate is smaller. FIG. 12 is a graph showing the relationship between the off-angle of the crystal plane of the GaAs substrate and the bandgap of an AlGaInP-based semiconductor (Al compositional ratio: 0.15). The bandgap is determined by the light-emitting wavelength of the photoluminescence (PL). It was confirmed that the bandgap is smaller in the region of a smaller off-angle for the crystal plane of the GaAs substrate. AlGaInP-based semiconductors are known to have smaller bandgaps when a natural superlattice is formed in the semiconductor film (J. Crystal Growth, Vol. 93 (1986), p. 396, Appl. Phys. Lett., Vol. 50 (1987), p. 673). FIG. 12 implies that a natural superlattice is likely to be formed when the off-angle of the crystal plane of the GaAs substrate is smaller and that the occurrence of a natural superlattice is suppressed when the off-angle is larger. The data in FIG. 12 shows a situation in which the Al compositional ratio is relatively low and a direct transition occurs, since the measurement of the bandgap was based on the PL light-emitting wavelength. However, the same trend is apparent even when the Al compositional ratio is relatively high and an indirect transition occurs, as suggested by the graph shown in FIG. 13, which will be described below.

Figure 13:
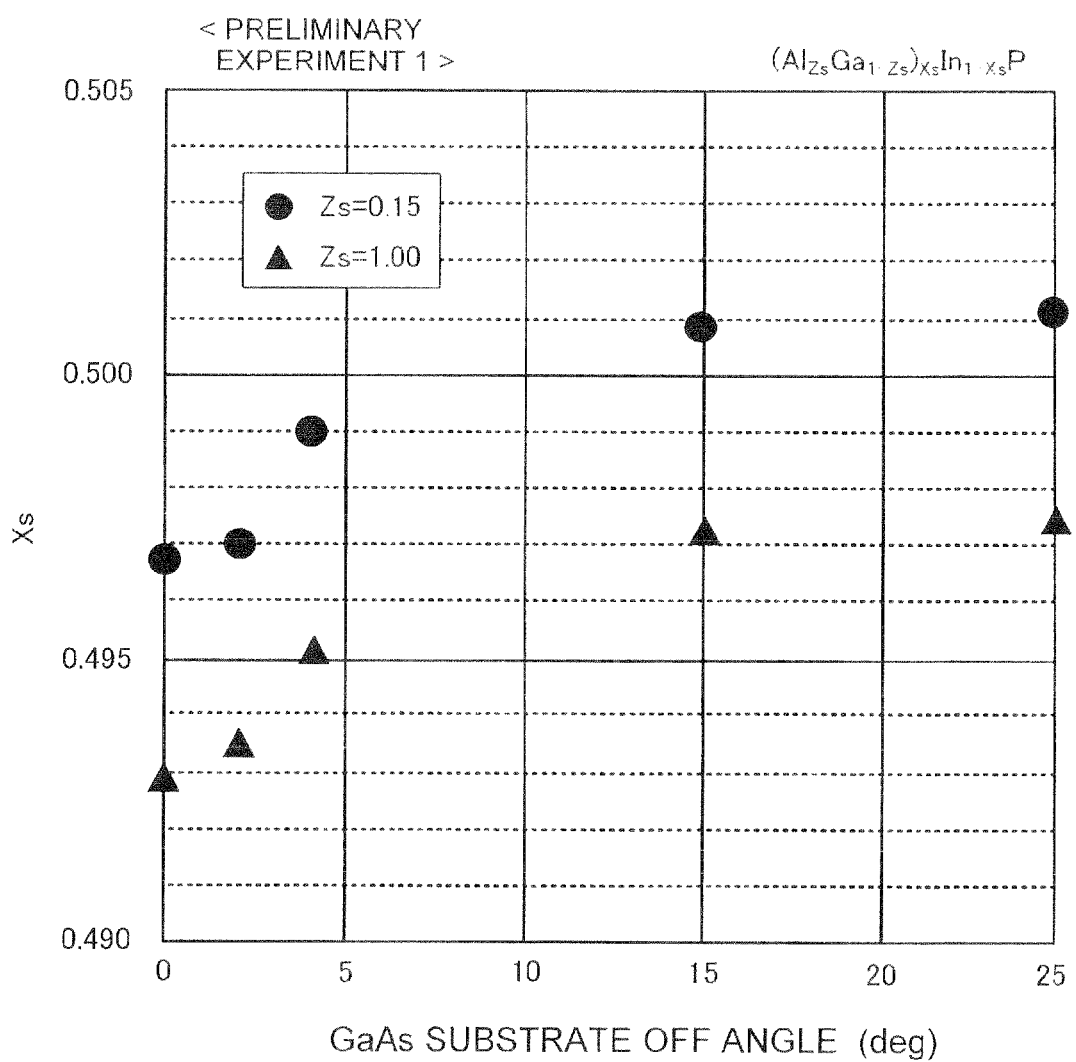
FIG. 13 shows the change in the $(Al_{Zs}Ga_{1-Zs})$ compositional ratio when the off-angle of the crystal plane of the growth substrate is changed in an AlGaInP-based semiconductor light-emitting device.

The relationship between the off-angle of the crystal plane of the GaAs substrate and the occurrence of a natural superlattice is suggested by the data in FIG. 13. FIG. 13 is a graph showing the relationship between the off-angle of the crystal plane of the GaAs substrate and the compositional ratio Xs of $Al_{Zs}Ga_{1-Zs}$ in a semiconductor composed of $(Al_{Zs}Ga_{1-Zs})_{Xs}In_{1-Xs}P$. In FIG. 13, the Al compositional ratio (Zs) is 0.15 (indicated by the black circles) and 1.0 (indicated by the black triangles). It is confirmed from FIG. 13 that Xs decreases or the In compositional ratio (1-Xs) increases in the region with a small off-angle for the crystal plane of the GaAs substrate, irrespective of the magnitude of the Al compositional ratio. A natural superlattice is the phenomenon in which identical atoms are arranged in order on a given crystal plane. However, the incorporation balance between elements during crystal growth is considered to change when the driving force during the orderly arrangement of the atoms is high. When the off-angle of the crystal plane of the GaAs substrate is small, the incorporation amount of In atoms is considered to increase and a natural superlattice to occur irrespective of the Al compositional ratio.

Because the relationship between the off-angle of the crystal plane of the GaAs substrate and the reverse withstand voltage Vr defect rate shown in FIG. 11 agrees with the relationship between the off-angle of the crystal plane of the GaAs substrate and the occurrence of a natural superlattice shown in FIGS. 12 and 13, the in-plane variations of the reverse withstand voltage Vr in the wafer of the semiconductor light-emitting device 1 of Comparative Example-1 can be assumed to be closely related to the natural superlattice formed in the semiconductor film. The occurrence of a natural superlattice can be directly confirmed by performing localized observations using a high-performance transmission electron microscope (TEM) to verify the atomic arrangement.

Figure 14:
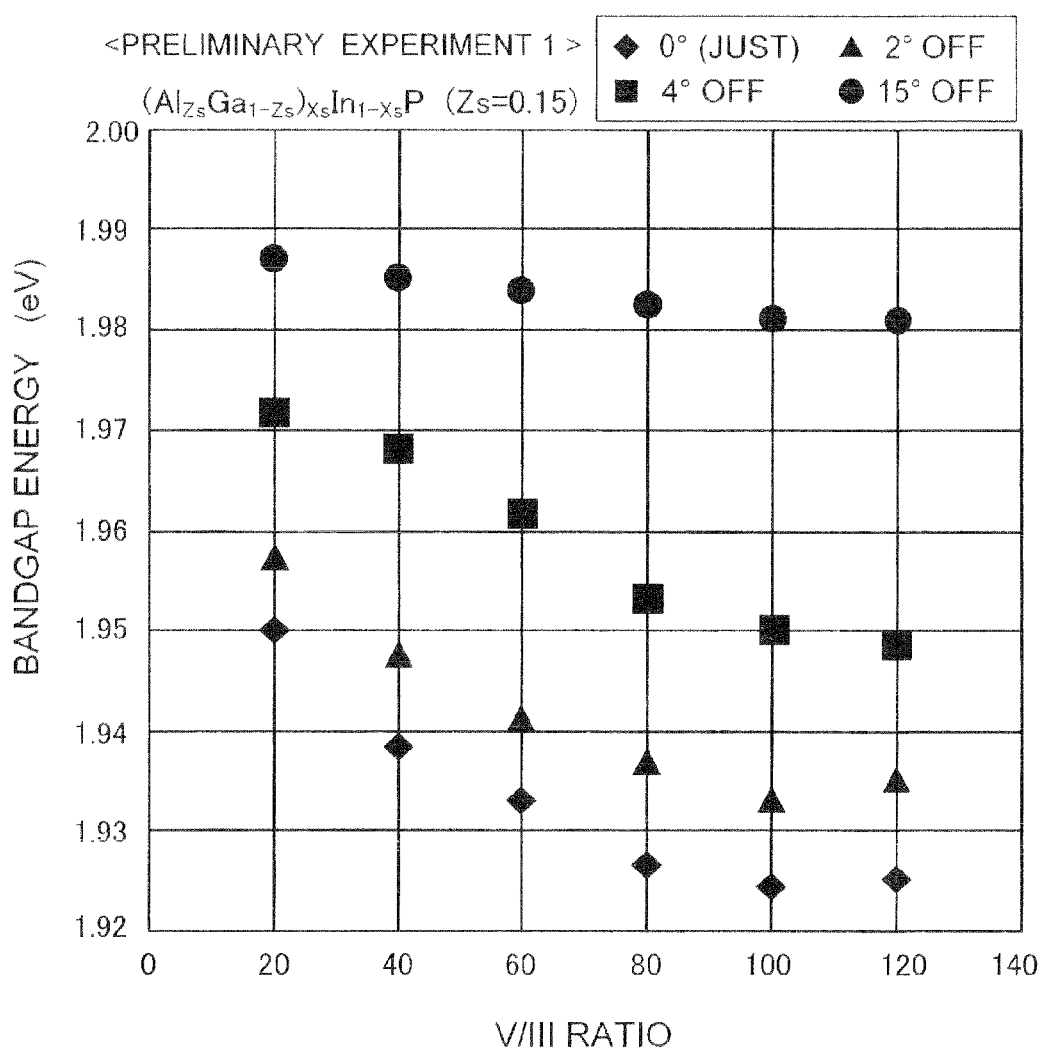
FIG. 14 shows the change in the bandgap when the V/III ratio is changed in an AlGaInP-based semiconductor light-emitting device.

FIG. 14 is a graph showing the relationship between the bandgap and the V/III ratio of an AlGaInP-based semiconductor (Al compositional ratio: 0.15). Here, the off-angles for the crystal plane of the GaAs substrate from the (100) plane to the [011] direction are 0°, 2°, 4° and 15°. The V/III ratio is the number of moles of Group V elements divided by the number of moles of Group III elements contained in the gas supplied during the vapor phase epitaxial growth of the semiconductor layer. In other words, this is the supply ratio of Group V elements to Group III elements. It is clear from FIG. 14 that the bandgap becomes smaller as the V/III ratio increases. This means a natural superlattice is more likely to be formed as the V/III ratio increases. The results in FIG. 12 suggest that the occurrence of a natural superlattice is suppressed when the off-angle of the crystal plane of the GaAs substrate is larger, and that a natural superlattice is formed when, for example, the V/III ratio is increased even using a 15° inclined substrate. In these cases, the reverse withstand voltage Vr defect rate is likely to become worse. Thus, a semiconductor light-emitting device of the present invention can reduce the reverse withstand voltage Vr defect rate caused by a natural superlattice without compromising light output and can ensure high, stable manufacturing yields, irrespective of growth conditions such as the off-angle of the crystal plane of the growth substrate and the V/III ratio.

Preliminary Experiment 2

Figure 15:
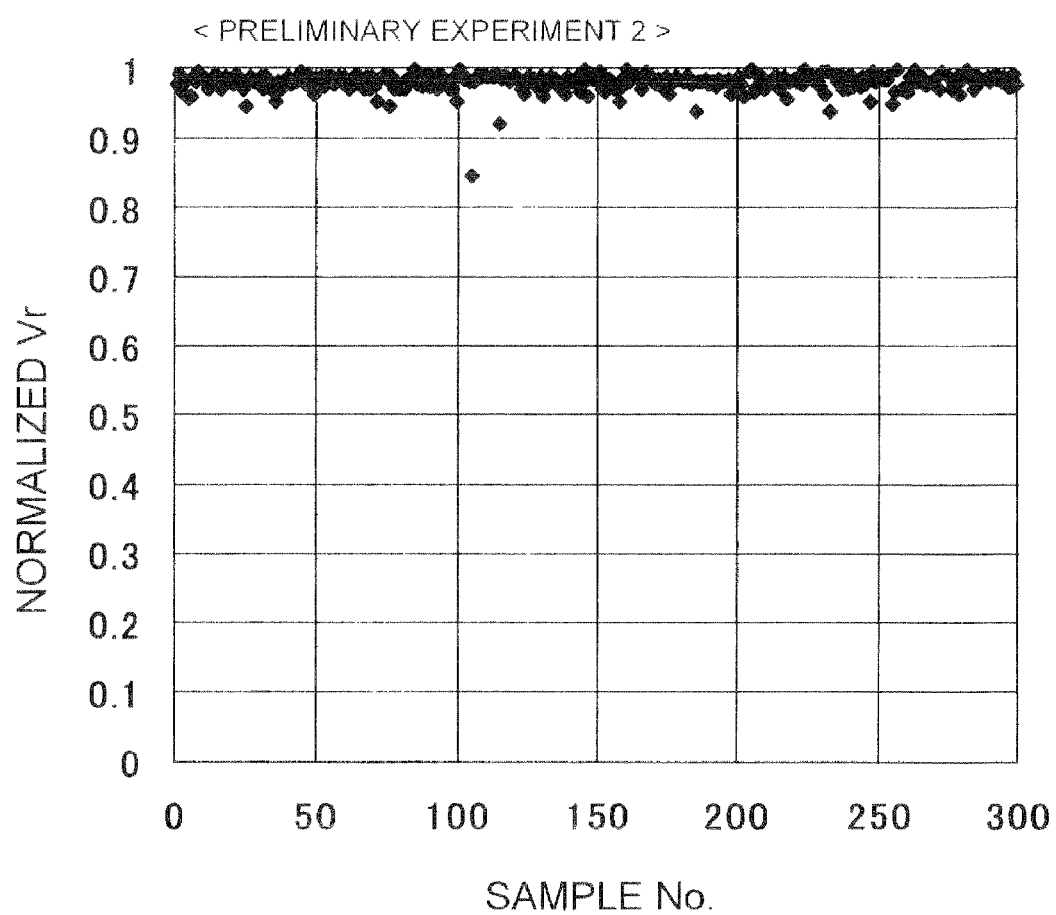
FIG. 15 shows the reverse withstand voltage Vr variations in the wafer surface when the composition of the p-type clad layer is $Al_{0.5}In_{0.5}P$, and the composition of the n-type clad layer is $(Al_{0.7}Ga_{0.3})_{0.5}In_{0.5}P$.

A study was conducted to determine whether the in-plane variations of the reverse withstand voltage Vr in the wafer of an AlGaInP-based semiconductor light-emitting device is caused by the n-type clad layer, the p-type clad layer or both clad layers. Semiconductor light-emitting devices were prepared in which the composition of the p-type clad layer is $Al_{0.5}In_{0.5}P$, which is likely to form an Al ordered arrangement, and in which the composition of the n-type clad layer is $(Al_{0.7}Ga_{0.3})_{0.5}In_{0.5}P$, which is unlikely to form an Al ordered arrangement, and 30 samples were randomly extracted from the wafer to measure the reverse withstand voltages Vr. The results of the reverse withstand voltage Vr measurements are shown in FIG. 15. In FIG. 15, the horizontal axis denotes the sample number, and the vertical axis shows the values normalized using the maximum value for the reverse withstand voltage Vr. The values for the reverse withstand voltage Vr were confirmed to be stable even when the composition of the p-type clad layer was $Al_{0.5}In_{0.5}P$, which is likely to form an Al ordered arrangement. In other words, this means a natural superlattice is unlikely to be formed in the p-type clad layer, even when the p-type clad layer is $Al_{0.5}In_{0.5}P$. This is because Zn, the p-type impurity, is readily dispersed in the p-type clad layer, and this movement is considered to destroy or resolve the natural superlattice structure. In other words, the cause of variations in the reverse withstand voltage Vr in the wafer is to be found in the n-type clad layer and not in the p-type clad layer. Thus, the composition and thickness of the p-type clad layer 13 can be selected as desired. Even the use of a material other than AlGaInP, such as AlGaAs, has no influence on the effect of the present invention.

It is clear from the above description that a natural superlattice is formed in the semiconductor film of an AlGaInP-based semiconductor light-emitting device due to the off-angle of the crystal surface of the growth substrate and the growth conditions, and that this is likely to cause deterioration in reverse withstand voltage Vr and manufacturing yield. According to the semiconductor light-emitting device of the present invention, the n-type clad layer 11 has a layered structure composed of a first n-type clad layer 11a of AlGaInP, which is unlikely to form an Al ordered arrangement, and a second n-type clad layer 11c of AlInP, which is more likely to form an Al ordered arrangement but functions to effectively provide the carrier confinement effect especially in the high voltage region. The thickness of the second n-type clad layer 11b is from 40 to 200 nm. This can suppress variations in the reverse withstand voltage Vr and reduce the defect rate irrespective of the off-angle of the crystal plane of the growth substrate and the growth conditions. The light output in the high current range is also not compromised.

The invention has been described with reference to the preferred embodiments thereof. It should be understood by those skilled in the art that a variety of alterations and modifications may be made from the embodiments described above. It is therefore contemplated that the appended claims encompass all such alternations and modifications.

This application is based on Japanese Patent Application No. 2010-011030 which is hereby incorporated by reference.

What is claimed is:

1. A semiconductor light-emitting device comprising a semiconductor film including an active layer composed of AlGaInP, and an n-type clad layer and a p-type clad layer disposed so as to sandwich said active layer, said n-type clad layer and said p-type clad layer each having a bandgap greater than the bandgap of said active layer, wherein
    said n-type clad layer includes a first n-type clad layer composed of AlGaInP and a second n-type clad layer composed of AlInP; and
    said second n-type clad layer has a thickness in the range of 40 nm to 200 nm.

2. The semiconductor light-emitting device according to claim 1, wherein said second n-type clad layer includes a natural superlattice structure, in which constituent elements form an ordered arrangement.

3. The semiconductor light-emitting device according to claim 1, wherein said second n-type clad layer is formed on said active layer, and said first n-type clad layer is formed on said second n-type clad layer.

4. The semiconductor light-emitting device according to claim 1, wherein said first n-type clad layer is formed on said active layer, and said second n-type clad layer is formed on said first n-type clad layer.

5. The semiconductor light-emitting device according to claim 1, wherein said second n-type clad layer is disposed between two first clad layers each composed of AlGaInP.

6. The semiconductor light-emitting device according to claim 1, wherein said first n-type clad layer and said second n-type clad layer are repeatedly stacked in an alternating fashion.

7. The semiconductor light-emitting device according to claim 1, wherein said semiconductor film is joined to a support substrate with a metal layer interposed therebetween.

* * * * *